(12) United States Patent
Hwang et al.

(10) Patent No.: US 8,674,678 B2
(45) Date of Patent: Mar. 18, 2014

(54) DEVICE, SYSTEM AND METHOD FOR LOCATING A PIPE

(75) Inventors: Tae-Joon Hwang, North York (CA); Corry Comello, North York (CA); Bill O'Brien, North York (CA); Paul Laursen, North York (CA)

(73) Assignee: Enbridge Gas Distribution Inc., North York (CA)

( * ) Notice: Subject to any disclaimer, the term of this patent is extended or adjusted under 35 U.S.C. 154(b) by 555 days.

(21) Appl. No.: 12/834,739

(22) Filed: Jul. 12, 2010

(65) Prior Publication Data

US 2012/0006116 A1 Jan. 12, 2012

(30) Foreign Application Priority Data

Jun. 10, 2010 (CA) .................................... 2707557

(51) Int. Cl.
*G01V 3/10* (2006.01)
(52) U.S. Cl.
USPC ............................... 324/67; 324/66; 73/865.8
(58) Field of Classification Search
USPC ................... 73/431, 865.8, 866.5; 324/66, 67
See application file for complete search history.

(56) References Cited

U.S. PATENT DOCUMENTS

| | | | | | |
|---|---|---|---|---|---|
| 252,956 | A | * | 1/1882 | Loane | 254/134.4 |
| 1,805,426 | A | * | 5/1931 | Vanatta | 206/227 |
| 2,487,726 | A | * | 11/1949 | Powell | 242/118.4 |
| 3,547,406 | A | * | 12/1970 | Fowler et al. | 254/134.4 |
| 3,618,872 | A | * | 11/1971 | Witkowski | 242/118.61 |
| 3,991,363 | A | * | 11/1976 | Lathrop | 324/529 |
| 4,016,748 | A | * | 4/1977 | Boyens | 73/40.5 R |
| 4,485,668 | A | * | 12/1984 | Hudson et al. | 73/40.5 A |
| 4,690,006 | A | * | 9/1987 | Urata | 73/866.5 |
| 4,848,168 | A | * | 7/1989 | Negishi | 73/865.8 |
| 4,894,539 | A | * | 1/1990 | Hurst | 250/303 |
| 4,958,128 | A | * | 9/1990 | Tomoyasu et al. | 324/559 |
| 5,181,668 | A | * | 1/1993 | Tsuji et al. | 242/387 |
| 5,194,812 | A | * | 3/1993 | Yokoi | 324/326 |
| 5,264,795 | A | * | 11/1993 | Rider | 324/326 |
| 5,929,624 | A | * | 7/1999 | Ricq et al. | 324/67 |
| 5,992,246 | A | * | 11/1999 | Nice | 73/865.8 |
| 6,140,819 | A | * | 10/2000 | Peterman et al. | 324/326 |

(Continued)

FOREIGN PATENT DOCUMENTS

JP 63075663 * 4/1988 ............ G01N 29/04

OTHER PUBLICATIONS

"Enameled Magnet Wire", Infantron Wire & Cable, archived by the Internet Archive on Mar. 5, 2008.*
"4 Vintage Wood Spools", Oak Bluffs Classifieds, 2002.*

*Primary Examiner* — David A Rogers
(74) *Attorney, Agent, or Firm* — SoCal IP Law Group LLP; Mark A. Goldstein

(57) ABSTRACT

A device, system and method of locating a target pipe in a pipe system utilizes an electric signal transmitter and an electrical signal detector. A pipe locator signal conductor comprises a spool and a flexible insulated electrical conductor wound around the spool. The exposed end of the conductor is fixed near an entry point in the pipe system, and the spool is fed into the pipe system such that the conductor pays off of the spool and extends at least partially through the target pipe. The signal transmitter is coupled to the exposed end of the conductor, transmitting a signal through the conductor and allowing the pipe to be located by the signal detector.

5 Claims, 1 Drawing Sheet

(56) References Cited

U.S. PATENT DOCUMENTS

| | | | |
|---|---|---|---|
| 6,353,320 B1* | 3/2002 | Eslambolchi et al. | 324/326 |
| 6,373,252 B1* | 4/2002 | Eslambolchi et al. | 324/326 |
| 6,380,743 B1* | 4/2002 | Selvog | 324/326 |
| 6,561,488 B1* | 5/2003 | Walker | 254/134.4 |
| 6,715,370 B2* | 4/2004 | Tasca | 73/865.8 |
| 7,356,421 B2* | 4/2008 | Gudmundsson et al. | 702/38 |
| 8,167,102 B2* | 5/2012 | Skillman | 191/12.2 R |
| 8,209,136 B2* | 6/2012 | Li | 702/38 |
| 2002/0011124 A1* | 1/2002 | Phipps | 73/865.8 |
| 2003/0121338 A1* | 7/2003 | Yates | 73/865.8 |
| 2003/0150285 A1* | 8/2003 | Tasca | 73/865.8 |
| 2004/0025607 A1* | 2/2004 | Rantala et al. | 73/866.5 |
| 2005/0172737 A1* | 8/2005 | Bond | 73/865.8 |
| 2006/0101915 A1* | 5/2006 | Thompson et al. | 73/592 |

* cited by examiner

DEVICE, SYSTEM AND METHOD FOR LOCATING A PIPE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This application claims the benefit of priority to Canadian Patent Application No. 7,707,557, filed Jun. 10, 2010, of which full contents are incorporated herein by reference.

FIELD OF THE INVENTION

This invention relates to a device, system and method for locating pipes. In particular, this invention relates to a device, system and method for locating pipes such as underground waste, drainage and sewer pipes.

BACKGROUND OF THE INVENTION

A typical urban residential, commercial or industrial property is serviced by many utilities, including water supply and waste drainage. The pipes which carry water into a premises on the property and drain wastewater from the premises into a sewer system are conventionally buried underground.

Utilities can be installed at different times. Particularly in the case of residential premises, the installation of a natural gas services and mains may occur many years after the premises are erected, for example when the owner changes to a gas heating system from another system or when a gas main on a street is replaced.

Gas pipes at such new installations were for many decades laid in trenches, which allowed service personnel to see the locations of existing underground infrastructure. However, trenching is an expensive and often disruptive process.

More recently, gas lines have been installed underground by guided boring devices which burrow through a landmass horizontally and create a path for a conduit such as a gas pipe. This technique is considerably less expensive and less disruptive than trenching. However, it has the disadvantage that service personnel cannot see what is beneath the land mass in order to avoid obstacles such as pipelines for other services.

The safe installation of utility lines in built up or established areas by horizontal drilling or "torpedoing" requires knowledge of the exact location of other utility lines, so that they may be avoided during installation. Waste drainage and sewer pipes are particularly problematic because of their relatively large size and composition.

Sewer laterals and other waste drainage pipes may be composed of metal or clay or, in the case of newer houses, plastic such as polyvinyl chloride (PVC). Such pipes are typically four to six inches in diameter and buried four to seven feet beneath the surface of the ground. However, the locations of waste drainage pipes are not consistent, particularly in neighbourhoods where the housing may be very old.

If a horizontal drilling device encounters a clay or plastic drainage or sewer pipe in the course of operation, it will typically punch through the pipe (often unbeknownst to the operator). The gas pipe can then be installed through the sewer lateral or other waste drainage pipe. This can lead to many potential problems, including leakage of wastewater into the ground surrounding the property or potentially a build-up of gas within the drainage or sewer pipe.

A number of technologies and techniques are used today to locate electrical, telephone and water utilities. For example, in many common ground conditions metal detectors can be used to locate metal pipes. However, other than trenching, there is no method for consistently and precisely locating buried non-metallic pipes, such as plastic or clay drainage or sewer pipes. Neither clay nor plastic is electrically conductive, so most techniques used for locating other types of utility lines are ineffective. For example, metal detectors cannot detect clay or plastic. Also, in regions where the soil consists of a great amount of clay from three feet down, the use of ground penetrating radar, which is a popular method of utility line location, is ineffective.

Newer non-metallic waste drainage and sewer pipes may be equipped with a conductive wire extending along their length. An electrical signal transmitted through the wire can be detected by surface equipment, thus providing the location and direction of the pipe (and in some cases an estimate of its depth). An example of such surface detection equipment is the RD4000 Transmitter/Receiver by Radiodetection (Trademark). However, this methodology requires that the pipe to be located be equipped with a conductor (essentially an antenna) through which the locating signal can be transmitted for sensing by the receiver.

There is thus a need for a system and method which can accurately and consistently locate buried non-metallic pipes such as plastic or clay waste drainage or sewer pipes that are not equipped with an electrical conductor, from aboveground.

BRIEF DESCRIPTION OF THE DRAWINGS

In drawings which illustrate by way of example only a preferred embodiment of the invention.

DETAILED DESCRIPTION OF THE INVENTION

The invention provides a device for locating a target pipe, comprising: a spool, a flexible, insulated electrical conductor for winding around the spool, the conductor comprising an exposed end for coupling to an electrical signal transmitter, whereby when the spool is fed through the pipe the conductor pays off of the spool to form an antenna at least partially within the target pipe emitting a signal which can be located by a signal detector.

The invention further provides a system for locating a target pipe, comprising: an electric signal transmitter and an electrical signal detector, and a pipe locator signal conductor comprising a spool and a flexible insulated electrical conductor wound around the spool, the conductor comprising an exposed end for coupling to the electrical current transmitter, whereby when the spool is fed through the pipe the conductor pays off of the spool to form an antenna at least partially within the target pipe emitting a signal which can be located by the signal detector.

In further aspects of the device and system of the invention, the spool comprises biodegradable material; the spool comprises a mixture of wood particles and water-based glue; the particle size ranges from about 0.1 mm to about 2 mm; the spool is generally spherical; the spool comprises a peripheral groove into which the electrical conductor is wound; the spool comprises a hole through the spool generally perpendicular to a plane containing the groove into which a shaft may be inserted around which the spool may be rotated to wind the conductor around the spool; the spool comprises a hole through the spool extending into the groove through which a leading end of the conductor may be fed to facilitate winding the conductor around the spool; and/or the exposed end of the conductor is provided with a terminal for coupling to the electrical current transmitter.

The invention further provides a method of locating a target pipe in a pipe system with an electric signal transmitter and an electrical signal detector, and a pipe locator signal conductor comprising a spool and a flexible insulated electrical conductor wound around the spool, comprising the steps of: a. in any order, i. feeding the spool into an entry point in the pipe system such that the conductor pays off of the spool and extends at least partially through the target pipe and ii. coupling the signal transmitter to the exposed end of the conductor; b. transmitting a signal through the conductor; and c. locating the pipe using the signal detector.

Further aspects of the method comprise the step of withdrawing the conductor from the pipe system, and/or using a toilet as the entry point in the pipe system.

Figure 1:
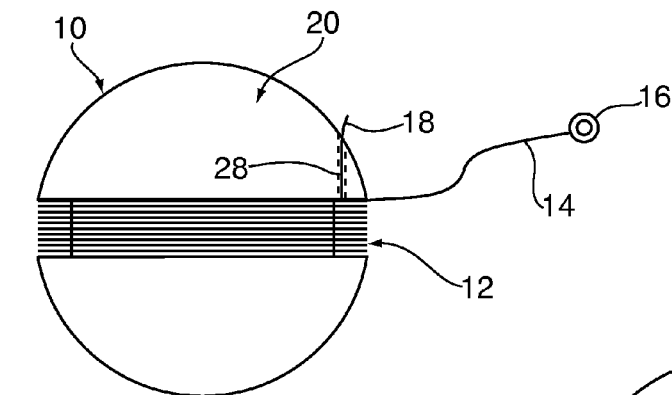
FIG. 1 is a diagrammatic elevational view of a pipe locator signal conductor device.

FIG. 1 is a perspective view of one embodiment of a pipe locator signal conductor device 10 according to the invention. The pipe locator signal conductor 10 illustrated comprises a spool 20, and a flexible, insulated electrical conductor wire 12 wound around the spool 20. The conductor wire 12 comprises an exposed portion 14 for coupling to any suitable electrical signal transmitter 30, for example (without limitation) the RD4000 Transmitter by Radiodetection (Trademark). In a preferred embodiment, the exposed portion 14 is pinched with an insulation-piercing terminal 16 to facilitate coupling to the electrical signal transmitter 30.

Figure 3:
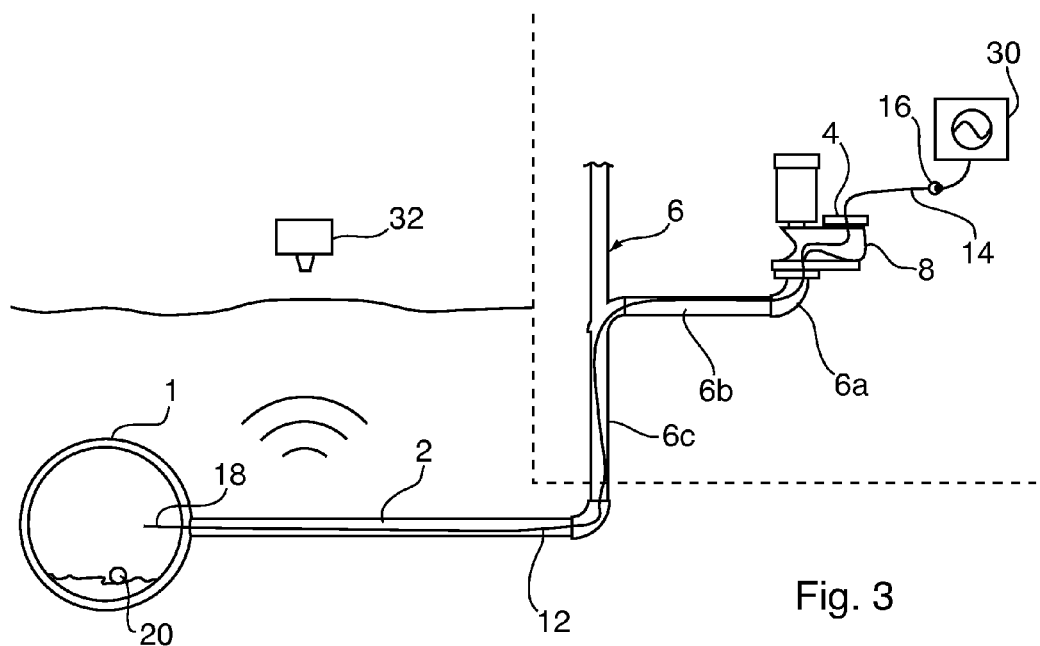
FIG. 3 is diagrammatic elevational view of the pipe locator signal conductor in the pipe locator signal conductor device of FIG. 1 fed through a pipe to be located.

According to a method of the invention, when the spool 20 is fed down a pipe 2 the wire 12 pays off of the spool 20 to form a signal transmitter antenna within the pipe 2, as illustrated in FIG. 3. The conductor wire 12 (and thus the pipe 2) can be located by any suitable signal detector 32 when the appropriate electrical signal is transmitted through the wire 12.

The conductor wire 12 is insulated, sufficiently long to extend from the entry point 4 into the target pipe 2 (i.e. the pipe desired to be located), and sufficiently flexible to unravel from the spool 20 as the spool 20 travels through the pipe system 6 from the entry point 4 into the target pipe 2. In one embodiment the conductor wire 12 has a weight of 28 AWG and a maximum diameter of about 0.35 mm (which weighs about 22 grams at a nominal length of about 100 feet/30.5 meters). An example of a wire suitable for the conductor wire 12 (without limitation) is Essex GP/MR-200.

It will be appreciated that the length of the conductor wire 12 will vary depending on the environment of the particular application, particularly the distance of the entry point 4 from the target pipe 2 and the length of the target pipe 2 desired to be located.

Figure 2:
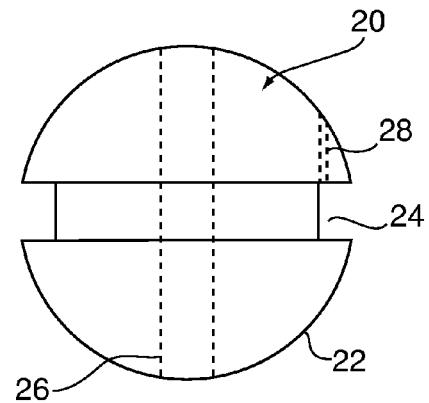
FIG. 2 is a diagrammatic elevational view of the spool in the pipe locator signal conductor device of FIG. 1.

FIG. 2 illustrates an embodiment of the spool 20. In the preferred embodiment the spool 20 is solid throughout and generally spherical. The spool periphery 22 comprises a continuous groove 24 extending about the periphery 22 into which the conductor wire 12 is wound, preferably circumscribing the maximum diameter of the spool 20 to optimize the length of conductor wire 12 that the spool 20 will accommodate. In a spool 20 with a diameter of about 4 cm the groove 24 may be about 1 cm wide by 5 mm deep. However, it will be appreciated that the width and depth of the groove 24 can vary depending on the length and weight of conductor wire 12 and the size of the spool 20. It will also be appreciated that the shape of the spool 20 can be other than spherical, although a spherical spool 20 may be less likely to become lodged in the pipe system 8 as the spool 20 is fed through the pipe in the manner described below.

In the preferred embodiment the spool 20 comprises a biodegradable material. The spool 20 should also be of a size and density that it can become entrained in flushing water and travel along the pipe system 6, and thus the spool 20 is preferably buoyant. In one embodiment, the spool 20 is manufactured using sawdust from pine or another low density wood using a non-toxic glue and water. The 4 cm spool 20 illustrated was manufactured using 12 g to 15 g of sawdust particles which range in size from 0.1 to 2 mm in diameter, with most particles being under 1 mm; 24 g to 27 g of a water-based or water-soluble glue, for example Ross brand non-toxic, washable White School Glue; and 3 g to 6 g of water. These ingredients were mixed to a homogeneous mass using a drill mixer (not shown). The spool 20 may be shaped by hand or with the help of molds (not shown). The shaped spools 20 may be arranged on a drying tray and air dried using a stream of dry air, which may be cycled on and off several times each hour. The resulting dried spool 20 has weight of about 11 g to 15 g.

The spool 20 may comprise a bore or hole 26 through the centre of the spool generally perpendicular to a plane containing the groove 24 (shown in phantom in FIG. 2), into which a shaft (not shown) can be inserted to facilitate winding the conductor wire 12 about the spool 20. A small bore or hole 28 (shown in phantom in FIGS. 1 and 2) may also be provided into which the leading end 18 of the conductor wire 12 is fed to hold the wire 12 as it is wound into the groove 24.

In operation, the spool 20 is loaded by winding the conductor wire 12 into the groove 24, optionally by mounting the spool 20 on a shaft (not shown) through hole 26.

The loaded spool 20 is fed through any suitable entry point 4 in the pipe system 6. In the embodiment shown the entry point 4 is a toilet 8 located in a residential premises (shown in phantom). The exposed end 14 of the conductor wire 12 is grasped by the operator, or otherwise fixed near the entry point 4, and thus remains outside of the pipe system 6.

The toilet is flushed, and the spool 20 travels through the closet flange 6a, waste pipe 6b and soil stack 6c, entrained in the water flowing into the pipe system 2 from the bowl of the toilet 8. As the spool 20 travels through the pipe system 6, the conductor wire 12 unravels from the groove 24 and pays off of the spool 20.

As noted above, the length of the conductor wire 12 is selected depending on the application, including the distance from the entry point 4 to the target pipe 8 and the distance through the target pipe 2 to the extent necessary to determine the position and orientation of at least a portion of the target pipe 2. The toilet 8 may need to be flushed multiple times to force the spool 20 to the point where the conductor wire 12 is fully paid out and the leading end 18 of the wire 20 slips out of the hole 28. The spool 20 then continues through the sewer system 1, disintegrating in the water as it travels.

Although a toilet 8 is a particularly convenient location for the entry point 4, because the waste pipe 6b is relatively large and a supply of flushing water is immediately available, the entry point 4 may be any other suitable location and water can be poured or otherwise introduced into the pipe system 6 to flush the spool 20 to and through the target pipe 2.

Once the conductor wire 12 is fully paid off the spool 20, as shown in FIG. 3, the signal transmitter 30 is coupled to the exposed end 14, for example to the terminal 16. An electrical signal is transmitted into the conductor wire 10, and the electromagnetic field is generated around the conductor wire 12 essentially creates a signal transmitter antenna through the target pipe 8. As is conventional, a suitable electromagnetic signal detector 32 above the ground detects the electromagnetic field generated underground around the conductor wire 12, and the location and orientation of the target pipe 2 is thus determined by the peak component of the electromagnetic field generated around the conductor wire 12, which represents the closest proximity (generally directly above) to the target pipe 2. The strength of the signal can provide an indication of the general distance of the conductor wire 12 (and thus the target pipe 2) from the signal detector 32, as is conventional.

Once the location procedure is complete, the conductor wire 10 may be withdrawn from the pipe system 6 through the entry point 4.

Embodiments of the present invention having been thus described in detail by way of example, it will be apparent to those skilled in the art that variations and modifications may be made without departing from the invention. The invention includes all such variations and modifications as fall within the scope of the appended claims.

It is claimed:

1. A method of locating a target pipe in a pipe system with an electric signal transmitter and an electrical signal detector, and a pipe locator signal conductor comprising a spool and a flexible insulated electrical conductor wound around the spool, comprising the steps of:
   a. in any order,
      i. feeding the spool into an entry point in the pipe system,
      ii flushing water into the pipe system such that the spool is entrained in a flow of water, and the conductor pays off of the spool as the spool is fed by the water into the target pipe, and extends at least partially through the target pipe, and
      iii. coupling the signal transmitter to the exposed end of the conductor,
   b. transmitting a signal through the conductor, and
   c. locating the pipe using the signal detector.

2. The method of claim 1 comprising the step of withdrawing the conductor from the pipe system.

3. The method of claim 1 wherein the spool comprises biodegradable material.

4. The method of claim 1 wherein the entry point in the pipe system comprises a toilet.

5. The method of claim 1 comprising, before step a., the step of winding the conductor around the spool.

\* \* \* \* \*